United States Patent
Ehlen

(10) Patent No.: US 8,911,251 B2
(45) Date of Patent: Dec. 16, 2014

(54) FLOATING BUS BAR AND CONNECTOR WITHIN CHASSIS

(71) Applicant: Jon Brian Ehlen, Milpitas, CA (US)

(72) Inventor: Jon Brian Ehlen, Milpitas, CA (US)

(73) Assignee: Facebook, Inc., Menlo Park, CA (US)

( * ) Notice: Subject to any disclaimer, the term of this patent is extended or adjusted under 35 U.S.C. 154(b) by 135 days.

(21) Appl. No.: 13/655,343

(22) Filed: Oct. 18, 2012

(65) Prior Publication Data

US 2014/0113473 A1    Apr. 24, 2014

(51) Int. Cl.
*H01R 13/64* (2006.01)
*H05K 7/14* (2006.01)

(52) U.S. Cl.
CPC .................................... *H05K 7/1489* (2013.01)
USPC ................ 439/251; 439/64; 439/215; 439/32

(58) Field of Classification Search
CPC ........... H01R 12/7005; H01R 12/7088; H01R 13/645; H01R 12/7064; H01R 31/02; H01R 12/62; H01R 12/7052; H01R 12/82; H01R 12/89; H01R 13/193; H01R 13/621; H01R 13/28; H01R 23/6886

USPC .............................. 439/215, 64, 131, 32, 251
See application file for complete search history.

(56) References Cited

U.S. PATENT DOCUMENTS

| 4,017,770 | A | * | 4/1977 | Valfre ........................... 361/756 |
| 5,618,197 | A | * | 4/1997 | Bodahl-Johnsen ........... 439/260 |
| 6,115,242 | A | * | 9/2000 | Lambrecht ..................... 361/788 |
| 6,239,975 | B1 | * | 5/2001 | Otis ............................. 361/727 |
| 7,784,888 | B2 | * | 8/2010 | Oh et al. ..................... 312/223.6 |

* cited by examiner

*Primary Examiner* — Xuong Chung Trans
(74) *Attorney, Agent, or Firm* — Fenwick & West LLP

(57) ABSTRACT

A chassis includes floating bus bars providing power and a sliding tray included in the chassis includes a power terminal and connecting fingers contacting the floating bus bars. As the sliding tray moves in a direction of motion, the connecting fingers remain in contact with the floating bus bars, providing power to components included on the sliding tray while it is repositioned. The floating bus bars are mounted inside the chassis in a direction parallel to the sliding direction of the sliding tray, and may be positioned within the chassis in a location that does not significantly impede airflow within the chassis.

21 Claims, 4 Drawing Sheets

FLOATING BUS BAR AND CONNECTOR WITHIN CHASSIS

BACKGROUND

This invention relates generally to connectors for providing power to sliding trays in a chassis.

Many servers and other computer systems contain components mounted on sliding trays, which allow a user to easily access and replace the components without having to open the chassis of the computer system. Conventionally, a flexible power cable is connected to the rear of the sliding tray to provide power to components on the tray. The flexibility of the power cable allows the cable to remain connected when the tray is slid out of the chassis. However, the power cable must be as long as the desired travel length of the tray. Thus, if access to the entire length of the sliding tray is desired, the power cable must be as long as the length of the tray. This causes the power cable to occupy a considerable amount of space when the tray is fully inside the chassis, and the occupied space impedes airflow within the chassis, limiting cooling of the components within the chassis.

SUMMARY

To improve airflow inside a chassis and to reduce the amount of occupied space inside the chassis, embodiments of the invention provide a floating bus bar and a bus bar connector for providing power to components on a sliding tray enclosed by the chassis. The bus bar connector includes a power terminal and two connecting fingers that engage with two floating bus bars, which are mounted inside the chassis in a direction parallel to the sliding direction of the sliding tray. The connecting fingers of a bus bar connector remain in contact with the bus bars as the sliding tray moves. The power terminal includes two conductors for connecting to a high supply voltage and a low supply voltage. Each conductor is coupled to one of the connecting fingers, and each connecting finger is positioned to contact with and press against one of the floating bus bars. The bus bars, connecting fingers, and power terminal are less obtrusive than a flexible power cable and other conventional solutions and can be mounted within the chassis without significantly impeding airflow within the chassis.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Figure 1B:
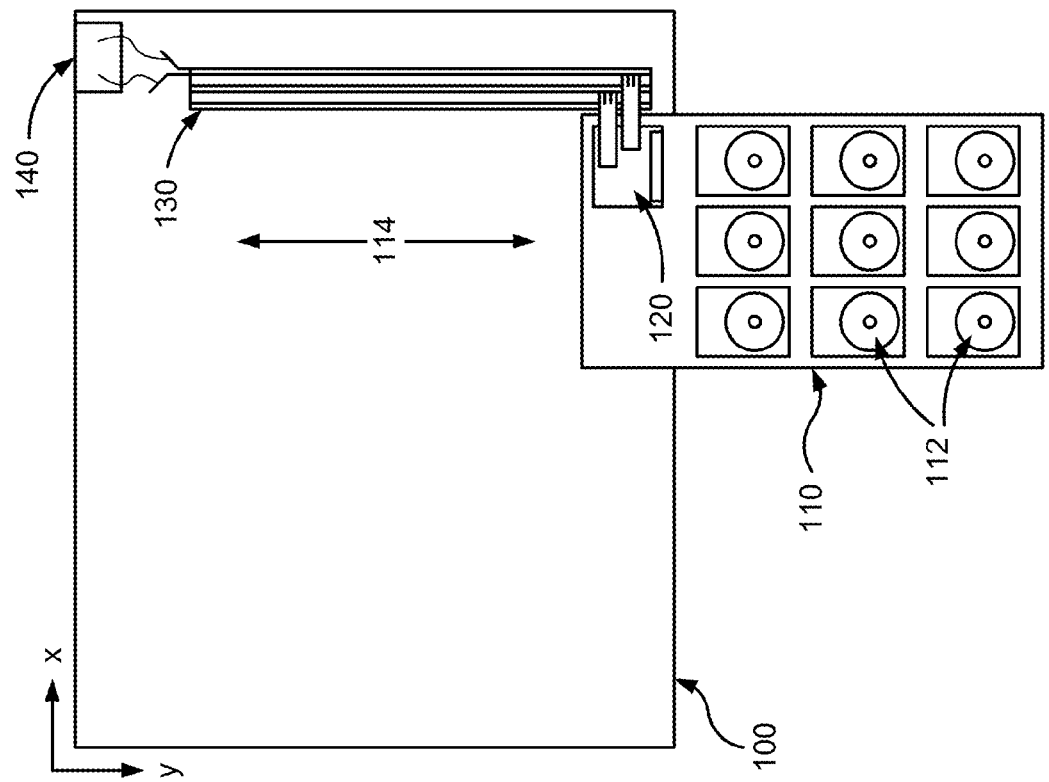
FIG. 1B is a top-down view of the chassis in FIG. 1A that illustrates the motion of the sliding tray, according to one embodiment.
Figure 1A:
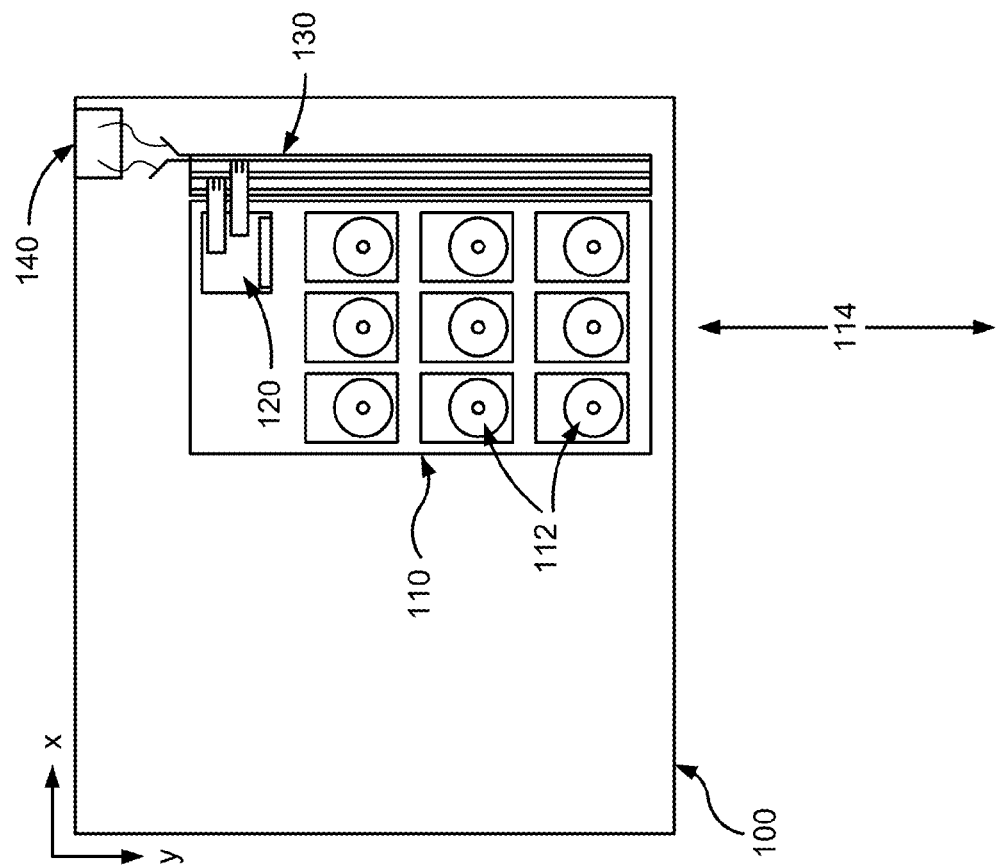
FIG. 1A is a top-down view of a chassis containing a sliding tray having a sliding bus bar power connector, according to one embodiment.

A sliding bus bar connector provides power to a sliding tray within a chassis of a computing asset. FIGS. 1A and 1B illustrate an example chassis 100 including a sliding tray 110, a sliding bus bar connector 120, and bus bars 130. Although only one sliding tray 110 is shown, the chassis 100 may also include additional sliding trays 110. FIGS. 1A and 1B are illustrated with respect to a set of three axes that are used consistently throughout the figures in order to show how the views in the figures are oriented relative to each other. In addition to the x- and y-axes that are shown, FIGS. 1A and 1B also include a z-axis (not pictured) that is oriented upward in a direction perpendicular to the plane of the page.

A computing asset housed in the chassis 100 may be any device that contains electronic components. For example, the computing asset may be a server or a personal computer capable of running an operating system and executing software applications. Alternatively, the computing asset may be a limited-function device, such as a network-attached storage system with a memory controller and a plurality of hard disks or solid state drives.

The sliding tray 110 within the chassis 100 is used for retaining electronic components 112 of the computing asset. In the illustrated embodiment, some of the electronic components 112 are hard disk drives. The sliding tray 110 may also include additional or different components 112, such as solid state drives, memory controllers, network controllers, processors, or other electronic devices. The sliding tray 110 is moveably mounted within the chassis 100 in a manner that allows the sliding tray 110 to slide between a first position, shown in FIG. 1A, and a second position, shown in FIG. 1B, along a sliding direction 114. In the first position, the sliding tray 110 is within the chassis 100. Being within the chassis 100 protects the components 112 from external hazards and allows the components 112 to be cooled by cooling systems that regulate the internal temperature of the chassis 100 (e.g., fans). In the second position, a portion of the sliding tray 110 is outside of the chassis 100, allowing a user to easily access the components 112 on the tray 110.

The sliding bus bar power connector 120 conductively couples the electronic components 112 in the sliding tray 110 to bus bars 130 mounted within the chassis 100. The bus bars 130 are connected to a power supply unit 140, which connects to an external power source. In one embodiment, the chassis 110 is mounted on a server rack and the power supply unit 140 is a connector that engages with a set of power bars mounted to the rear of the server rack. Alternatively, the power supply unit 140 includes a circuit that converts alternating current from a power outlet into direct current or another form more suitable for use by components in the sliding tray 110.

Together, the sliding bus bar connector 120, the bus bars 130, and power supply unit 140 provide supply voltages powering the electronic components 112. The sliding bus bar connector 120 is secured to the sliding tray 110 in a position that allows the sliding bus bar connector 120 to make contact with the bus bars 130 as the sliding tray 110 is moved between the first position and the second position along the sliding direction 114. In one embodiment, the connector 120 is mounted at a corner of the sliding tray 110 distal to an opening of the chassis 100. Thus, the components 112 remain connected to the supply voltages regardless of whether the sliding tray 110 is in the first position, in the second position, or being moved between the first and second positions. In addition, the bus bars 130 may be positioned within the chassis 110 so they do not significantly impede airflow within the chassis 110. This allows for more efficient interior cooling than conventional methods of connecting a sliding tray to a power supply, such as a pair of flexible power cables.

Although the chassis 100 described in conjunction with FIGS. 1A and 1B may house any type of computing asset, the improvements provided by the chassis 100 are particularly beneficial when a large number of storage devices, such as hard disk drives or solid state drives, are housed by the chassis 100. In these embodiments, the storage devices are retained in the sliding tray 110, beneficially allowing a user to access the storage devices without removing a side panel of the chassis 100. In addition, because the connector 120 and bus bars 130 may provide power to the components 112 on the sliding tray 110 regardless of the tray's position, a user may perform maintenance on one of the storage devices without powering down the other storage devices or components on the sliding tray 110. For example, this configuration is beneficial when the storage devices are part of a redundant array of independent disks (RAID) and replacement of single storage device is needed without disrupting the operation of the computing asset.

Figure 2A:
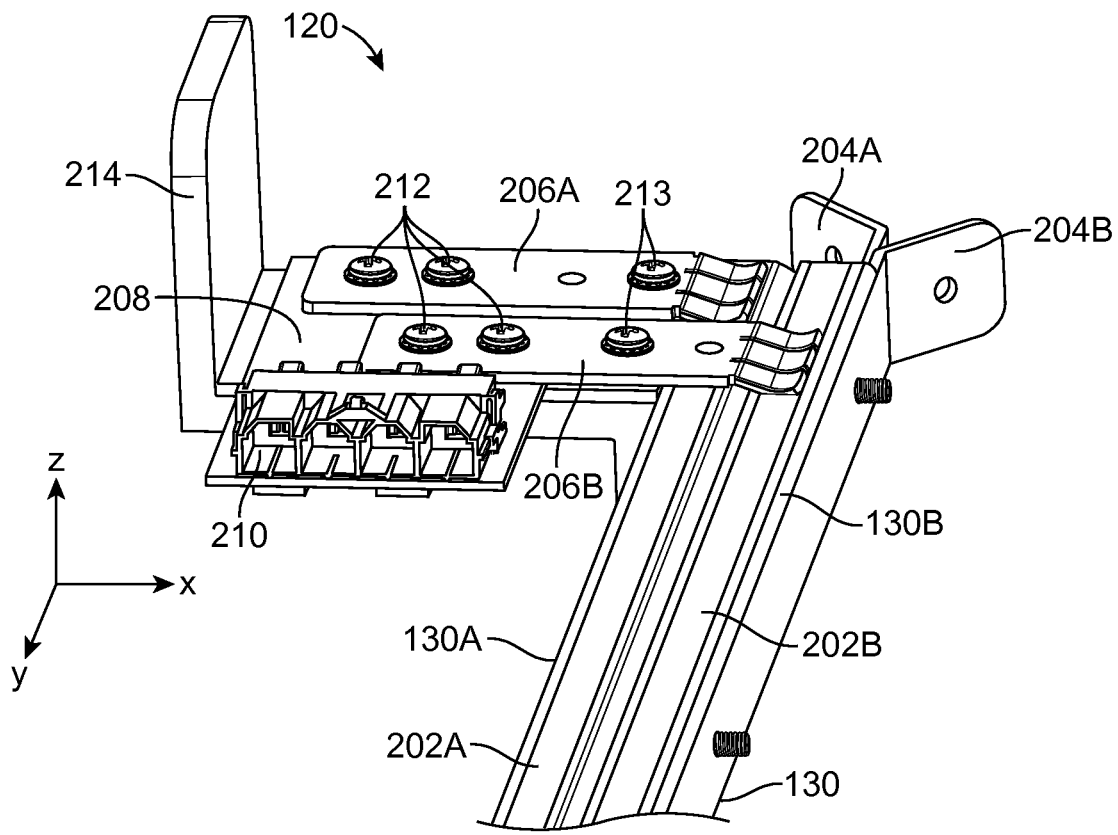
FIGS. 2A and 2B are perspective views of a sliding bus bar power connector and a pair of floating bus bars, according to one embodiment.

FIG. 2A is a perspective view of an embodiment of the sliding bus bar connector 120 and bus bars 130. In the embodiment shown by FIG. 2A, two bus bars 130A, 130B are mounted to a side of the sliding tray 110 (not shown in FIGS. 2A and 2B) so that a single sliding bus bar connector 120 engages both bus bars 130A, 130B. For purposes of illustration, in the embodiment shown by FIGS. 2A and 2B, the power supply unit 140 maintains the first bus bar 130A at a high supply voltage and maintains the second bus bar 130B at a low supply voltage. In other embodiments, the voltages of the bus bars 130A, 130B may be reversed.

Each bus bar 130A, 130B includes a contacting strip 202A, 202B along a top surface and a supply terminal 204A, 204B at a rear surface. The contacting strip 202A, 202B physically contacts a connecting finger 206A, 206B of the connector 120 to conduct electricity from the power supply 140 to computing devices in the sliding tray 100 via the finger 206A, 206B. The supply terminal 204A, 204B conductively couples the bus bar 130A, 130B to the power supply unit 140 to provide power to maintain the bus bars 130A, 130B at the appropriate supply voltages. In one embodiment, each supply terminal 204A, 204B includes a hole for connecting a power cable to the bus bars 130A, 130B using a screw terminal or other suitable method.

Each connecting finger 206A, 206B of the sliding bus bar connector 120 contacts with and presses against a contacting strip 202A, 202B on the corresponding bus bar 130A, 130B. This forms an electrical connection between the connecting finger 206A, 206B and the bus bar 130A, 130B. Thus, the first connecting finger 206A is at the high supply voltage of the bus bar 130A and the second connecting finger 206B is at the low supply voltage or the bus bar 130B.

The sliding bus bar connector 120 also includes a printed circuit board (PCB) 208, with a power terminal 210 mounted to the PCB 208. The power terminal 210 includes conductors each for coupling to one of the supply voltages from the first bus bar 130A and from the second bus bar 130B to the electronic components 112 on the sliding tray 100. For example, the first conductor of the power terminal 210 is coupled to the first connecting finger 206A to provide a high supply voltage, and the second conductor is coupled to the second connecting finger 206B to provide the low supply voltage. In one embodiment, the conductors of the power connector 210 are coupled to the corresponding connecting fingers 206A, 206B via conductive traces on the PCB 208. In some embodiments, the connector 120 may include multiple power terminals 210. For example, the embodiment illustrated in FIGS. 2A and 2B includes four power terminals 210 in a single housing mounted on the PCB 208.

The connecting fingers 206A, 206B are secured to the PCB 208 with a plurality of fasteners 212 (e.g., screws). In some embodiments, the PCB 208 is mounted to a carrier bracket 214, and the fasteners 212 also secure the connecting fingers 206A, 206B and PCB 208 to the carrier bracket 214. The sliding bus bar connector 120 may also include additional fasteners 213 that directly secure the connecting fingers 206A, 206B to the carrier bracket 214. To prevent unwanted conduction with the connecting fingers 206A, 206B and the PCB 208, the carrier bracket 214 may be insulated (e.g., with a powder coat) or made of a non-conductive material.

In some embodiments, the non-contacting surfaces of the bus bars 130A, 130B and the connecting fingers 206A, 206B may be covered with a non-conductive material, such as a powder coat, to prevent unwanted electrical conduction. For example, every surface of the bus bars 130A, 130B apart from the contacting strips 202A, 202B and the supply terminals 204A, 204B may be powder coated. Similarly, every surface of the connecting fingers 206A, 206B apart from the area contacting the contacting strips 202A, 202B may be powder coated.

Figure 2B:
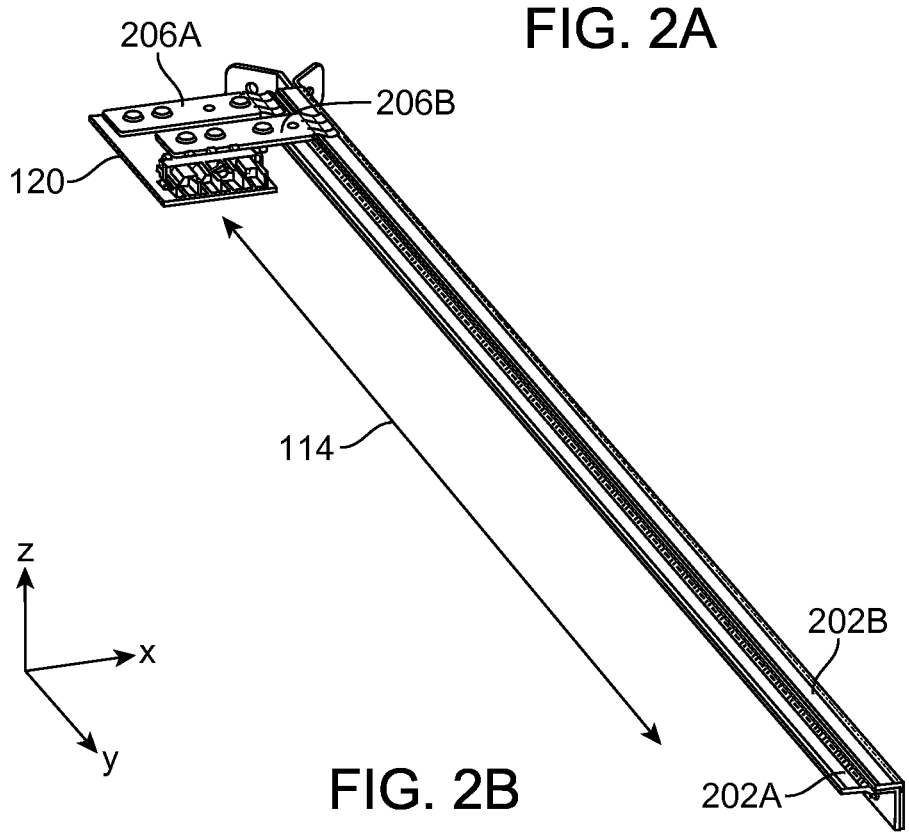

FIG. 2B is a different perspective view of the sliding bus bar connector 120 and the sliding bus bars 130 shown in FIG. 2A. Relative to FIG. 2A, the view of FIG. 2B is rotated counterclockwise about the z-axis and zoomed out so that the entire length of the bus bars 130 is visible. As the sliding tray 110 is moved along the sliding direction 114, the connecting fingers 206A, 206B remain in contact with the contacting strips 202A, 202B. Accordingly, the conductors in the power terminal 210 remain conductively coupled to the corresponding bus bars 130A, 130B.

In other embodiments, the bus bars may be configured differently than in the description presented with reference to FIGS. 1A-2B. For example, a single bus bar is mounted on each side of the sliding tray 100, which has two separate connectors each for engaging with one of the bus bars. In this configuration, each connector includes a single connecting finger. In another example, the chassis includes a single bus bar providing a supply voltage, and a different connection method (e.g., a flexible power cable) provides the second supply voltage to the sliding tray 110. Other embodiments may include three or more bus bars to provide three or more voltages to the components 112 in the sliding tray 110 (e.g., a positive supply voltage, a negative supply voltage, and a ground or reference voltage).

Figure 3A:
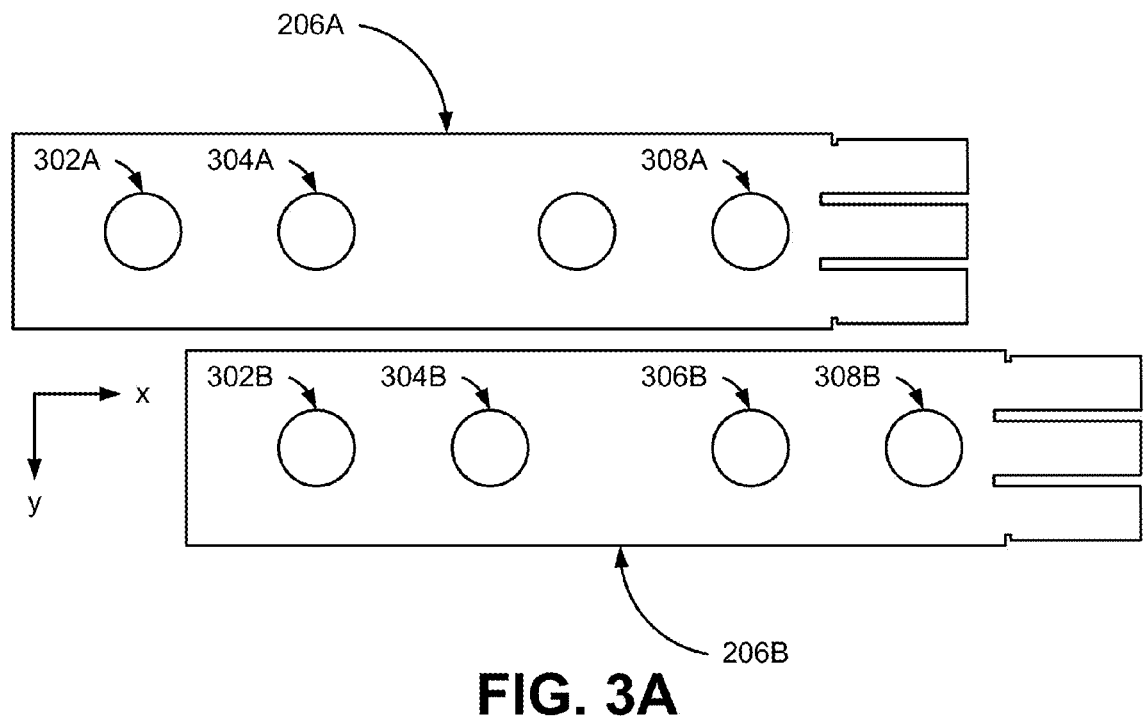
FIG. 3A is top-down view of the connecting fingers of the sliding bus bar power connector, according to one embodiment.
Figure 3B:
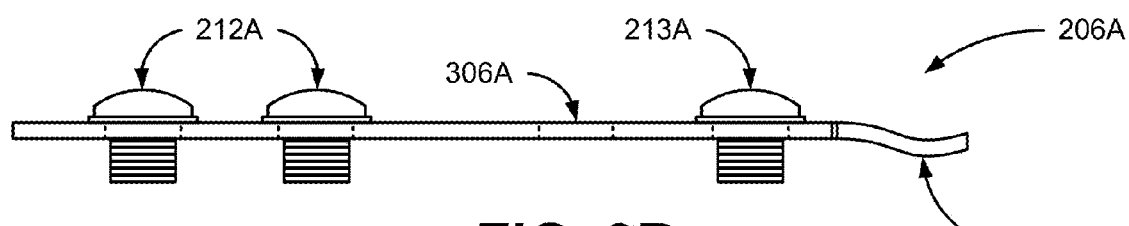
FIGS. 3B and 3C are side views of the connecting fingers of the sliding bus bar power connector, according to one embodiment.
Figure 3C:
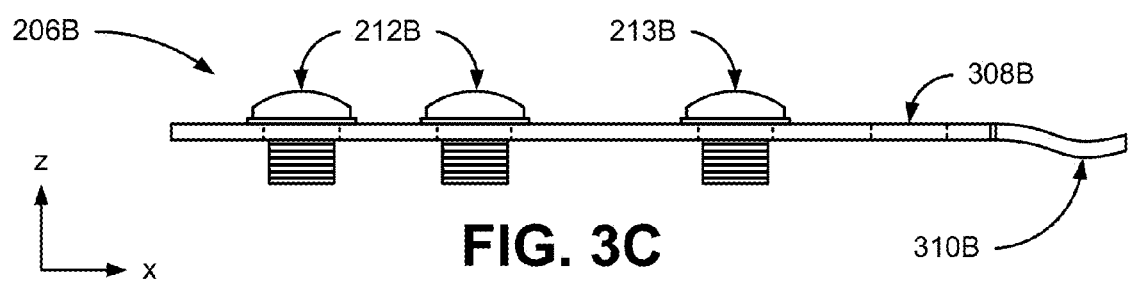

FIG. 3A is a top view of the two connecting fingers 206A, 206B. In the illustrated embodiment, each connecting finger 206A, 206B includes a series of four holes 302A, 304A, 306A, 308A, 302B, 304B, 306B, 308B for fastening the connecting finger 206A, 206B to the PCB 208 or to the carrier bracket 214. FIGS. 3B and 3C are side views of the two connecting fingers 206A, 206B. As described above with reference to FIG. 2A, fasteners 212A, 212B are inserted through the two holes 302, 304 of each connecting finger 206A, 206B to secure the connecting finger 206A, 206B to the PCB 208 and to the carrier bracket 214. Another fastener 213A is inserted through the fourth hole 308A to secure the first connecting finger 206A to the carrier bracket 214. Meanwhile, a fastener 213B is inserted through the third hole 306B to secure the second connecting finger 206B so that the third hole 306B is at the same position along the x-axis as the fourth hole 308A on the other connecting finger 206A. Securing the connecting fingers 206A, 206B in this manner causes the second connecting finger 206B to extend farther to the right than the first connecting finger 206A, so the second connecting finger 206B contacts the second bus bar 130B. Further, rather than using different connecting fingers having different length, this configuration allows the two connecting fingers 206A, 206B to have the same mechanical dimensions, lowering manufacturing costs and reducing the overall complexity of the sliding bus bar connector 120.

In some embodiments, the portion of the connecting finger 206A, 206B contacting the bus bar 130A, 130B has a downward curve. This prevents burrs on the edges of the connecting fingers 206A, 206B from damaging contacting strips 202A, 202 of the bus bars 130A, 130B.

Figure 4:
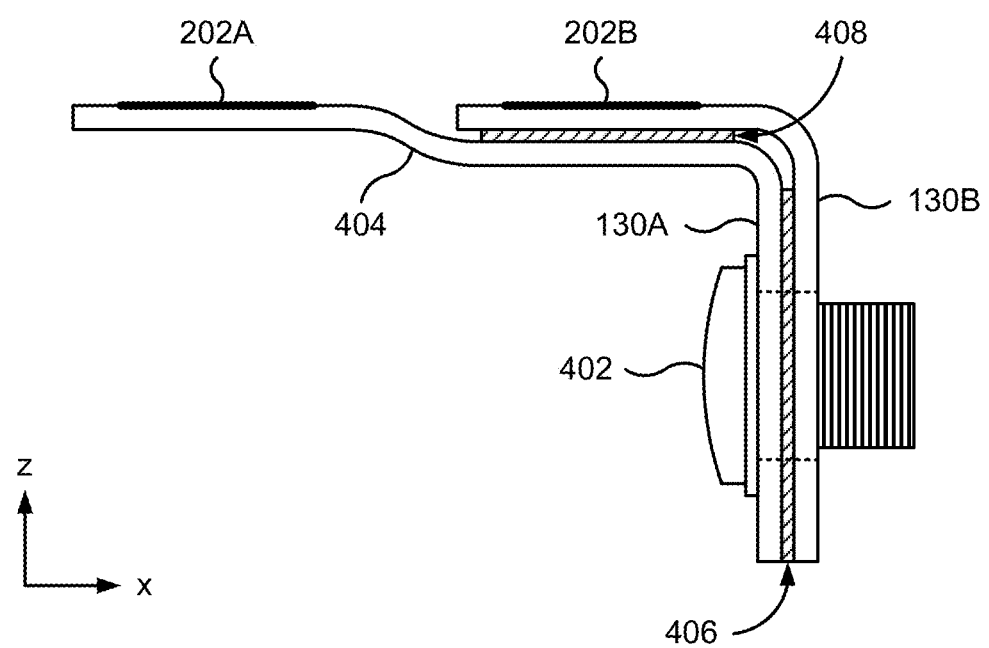
FIG. 4 is a cross-sectional view of the floating bus bars, according to one embodiment.

FIG. 4 is a cross-sectional view of one embodiment of the bus bars 130A, 130B. In the embodiment shown by FIG. 4, the cross section of two bus bars 130A, 130B has an L-shape allowing two bus bars 130A, 130B to be aligned and mechanically coupled to each other with one or more fasteners 402. An upper portion of the first bus bar 130A may have an upward curve 404 so that the conducting strips 202A, 202B of each of the bus bars 130A, 130B are positioned at the same height. Insulating sheets 406, 408 may be added in the space between the bus bars 130A, 130B to prevent short circuits. The insulating sheets 406, 408 may be omitted in embodiments where the non-contacting surfaces of the bus bars 130A, 130B are already covered with an insulating material, such as a powder coat.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A system comprising:
    a sliding tray for retaining one or more electronic components within a server chassis, the sliding tray configured to slide in a sliding direction between a first position and a second position, the sliding tray inside the server chassis in the first position and the sliding tray at least partially outside the server chassis in the second position;
    a power terminal mechanically coupled to the sliding tray, the power terminal comprising a first conductor for coupling a high supply voltage to the one or more electronic components and a second conductor for coupling a low supply voltage to the one or more electronic components;
    a first connecting finger conductively coupled to the first conductor of the power terminal, the first connecting finger having a surface configured to contact a first bus bar, the first connecting finger conductively contacting the first bus bar while the tray is sliding from the second to the first position, and the surface making conductive contact with the first bus bar being stationary with respect to the sliding tray when the sliding tray moves along the sliding direction;
    a second connecting finger conductively coupled to the second conductor of the power terminal, the second connecting finger having a surface configured to contact a second bus bar, the second connecting finger conductively contacting the second bus while the tray is sliding from the second to the first position, and the surface making conductive contact with the second bus bar being stationary with respect to the sliding tray when the sliding tray moves along the sliding direction;
    the first bus bar, oriented parallel to the sliding direction of the tray, the first bus bar providing the high supply voltage to the first conducting finger; and
    the second bus bar, oriented parallel to the sliding direction of the tray, the second bus bar providing the low supply voltage to the second conducting finger.

2. The system of claim 1, wherein the surface of the first connecting finger configured to contact the first bus bar is curved toward a lower surface of the server chassis.

3. The system of claim 1, wherein the surface of the second connecting finger configured to contact the second bus bar is curved toward a lower surface of the server chassis.

4. The system of claim 1, wherein surfaces of the first connecting finger not configured to contact the first bus bar are covered with an insulating material.

5. The system of claim 4, wherein the insulating material comprises a powder coat.

6. The system of claim 1, wherein surfaces of the first connecting finger not configured to contact the first bus bar are covered with an insulating material and surfaces of the second connecting finger not configured to contact the second bus bar are covered with the insulating material.

7. The system of claim 1, wherein the first bus bar is mechanically coupled to the second bus bar.

8. The system of claim 7, further comprising an insulating sheet positioned between the first bus bar and the second bus bar, the insulating sheet preventing electrical conduction between the first bus bar and the second bus bar.

9. The system of claim 1, wherein at least one of the electronic components retained in the sliding tray is a hard disk drive.

10. A system comprising:
    a first bus bar coupled to a chassis and oriented parallel to a sliding direction of a sliding tray in the chassis, the first bus bar for providing a high supply voltage;
    a second bus bar coupled to the chassis and oriented parallel to the sliding direction of the sliding tray, the second bus bar for providing a low supply voltage;
    a first connecting finger coupled to the sliding tray and having a surface configured to contact the first bus bar, the first connecting finger configured to conductively contacting the first bus bar when the sliding tray moves along the sliding direction from a second to a first position, and the surface making conductive contact with the first bus bar being stationary with respect to the sliding tray when the sliding tray moves along the sliding direction; and
    a second connecting finger coupled to the sliding tray and having a surface configured to contact the second bus bar, the second connecting finger configured to conductively contacting the second bus bar when the sliding tray moves along the sliding direction from the second to the first position, and the surface making conductive contact with the second bus bar being stationary with respect to the sliding tray when the sliding tray moves along the sliding direction;

wherein the first position is defined by the sliding tray being inside the server chassis and the second position is defined by the sliding tray being at least partially outside the server chassis.

11. The system of claim 10, wherein the surface of the first connecting finger configured to contact the first bus bar is curved in a direction toward a lower surface of the chassis.

12. The system of claim 10, wherein the surface of the second connecting finger configured to contact the second bus bar is curved in a direction toward a lower surface of the chassis.

13. The system of claim 10, wherein surfaces of the first bus bar not contacting the first connecting finger and surfaces of the second bus bar not contacting the second connecting finger are covered with an insulating material.

14. The system of claim 10, wherein surfaces of the first connecting finger not contacting the first bus bar and surfaces of the second connecting finger not contacting the second bus bar are covered with an insulating material.

15. The system of claim 10, wherein the first bus bar is mechanically coupled to the second bus bar.

16. The system of claim 15, further comprising an insulating sheet positioned between the first bus bar and the second bus bar, the insulating sheet preventing electrical conduction between the first bus bar and the second bus bar.

17. A system comprising:

a bus bar coupled to a chassis and oriented parallel to a sliding direction of a sliding tray in the chassis, the bus bar for providing a supply voltage; and a connecting finger coupled to the sliding tray, the connecting finger having a surface configured to conductively contacting the bus bar and to remain in contact with the bus bar when the sliding tray is moved along the sliding direction from a second to a first position, and the surface making conductive contact with the bus bar being stationary with respect to the sliding tray when the sliding tray moves along the sliding direction;

wherein the first position is defined by the sliding tray being inside the server chassis and the second position is defined by the sliding tray being at least partially outside the server chassis.

18. The system of claim 17, wherein the surface of the connecting finger configured to contact with and press against the bus bar is curved toward a lower surface of the chassis.

19. The system of claim 17, wherein surfaces of the connecting finger not contacting the bus bar are covered with an insulating material.

20. The system of claim 17, wherein surfaces of the bus bar not contacting the connecting finger are covered with an insulating material.

21. The system of claim 20, wherein the insulating material is a powder coat.

* * * * *